(12) United States Patent  
Arunasalam

(10) Patent No.: US 9,006,844 B2
(45) Date of Patent: Apr. 14, 2015

(54) PROCESS AND STRUCTURE FOR HIGH TEMPERATURE SELECTIVE FUSION BONDING

(75) Inventor: Parthiban Arunasalam, Austin, TX (US)

(73) Assignee: DunAn Microstaq, Inc., Austin, TX (US)

(*) Notice: Subject to any disclaimer, the term of this patent is extended or adjusted under 35 U.S.C. 154(b) by 0 days.

(21) Appl. No.: 13/574,343

(22) PCT Filed: Jan. 26, 2011

(86) PCT No.: PCT/US2011/022563
§ 371 (c)(1),
(2), (4) Date: Jul. 20, 2012

(87) PCT Pub. No.: WO2011/094300
PCT Pub. Date: Aug. 4, 2011

(65) Prior Publication Data
US 2012/0299129 A1    Nov. 29, 2012

Related U.S. Application Data

(60) Provisional application No. 61/299,328, filed on Jan. 28, 2010.

(51) Int. Cl.
  *H01L 21/30*    (2006.01)
  *B81B 3/00*    (2006.01)
  *B81C 1/00*    (2006.01)

(52) U.S. Cl.
  CPC ............. *B81B 3/001* (2013.01); *B81C 1/00269* (2013.01); *B81C 2203/0118* (2013.01); *B81C 2203/036* (2013.01)

(58) Field of Classification Search
  USPC ............ 257/415, 50, 678, 684, 704, E21.211, 257/E29.324; 438/706, 710, 455
  See application file for complete search history.

(56) References Cited

U.S. PATENT DOCUMENTS

| 668,202 A | 2/1901 | Nethery |
| 886,045 A | 4/1908 | Ehrlich et al. |

(Continued)

FOREIGN PATENT DOCUMENTS

| DE | 2215526 | 10/1973 |
| DE | 2930779 | 2/1980 |

(Continued)

OTHER PUBLICATIONS

PCT International Search Report and the Written Opinion, PCT/US2011/022563 filed Jan. 26, 2011, dated Jan. 28, 2010, AM0032.

(Continued)

*Primary Examiner* — Matthew Gordon
(74) *Attorney, Agent, or Firm* — MacMillan, Sobanski & Todd, LLC

(57) ABSTRACT

A method to prevent movable structures within a MEMS device, and more specifically, in recesses having one or more dimension in the micrometer range or smaller (i.e., smaller than about 10 microns) from being inadvertently bonded to non-moving structures during a bonding process. The method includes surface preparation of silicon both structurally and chemically to aid in preventing moving structures from bonding to adjacent surfaces during bonding, including during high force, high temperature fusion bonding.

15 Claims, 2 Drawing Sheets

(56) References Cited

U.S. PATENT DOCUMENTS

| | | |
|---|---|---|
| 1,886,205 A | 11/1932 | Lyford |
| 1,926,031 A | 9/1933 | Boynton |
| 2,412,205 A | 12/1946 | Cook |
| 2,504,055 A | 4/1950 | Thomas |
| 2,651,325 A | 9/1953 | Lusignan |
| 2,840,107 A | 6/1958 | Campbell |
| 2,875,779 A | 3/1959 | Campbell |
| 3,031,747 A | 5/1962 | Green |
| 3,540,218 A | 11/1970 | Finn |
| 3,729,807 A | 5/1973 | Fujiwara |
| 3,747,628 A | 7/1973 | Holster et al. |
| 3,860,949 A | 1/1975 | Stoeckert et al. |
| 4,005,454 A | 1/1977 | Froloff et al. |
| 4,019,388 A | 4/1977 | Hall, II et al. |
| 4,023,725 A | 5/1977 | Ivett et al. |
| 4,100,236 A | 7/1978 | Gordon et al. |
| 4,152,540 A | 5/1979 | Duncan et al. |
| 4,181,249 A | 1/1980 | Peterson et al. |
| 4,298,023 A | 11/1981 | McGinnis |
| 4,341,816 A | 7/1982 | Lauterbach et al. |
| 4,354,527 A | 10/1982 | McMillan |
| 4,434,813 A | 3/1984 | Mon |
| 4,476,893 A | 10/1984 | Schwelm |
| 4,543,875 A | 10/1985 | Imhof |
| 4,581,624 A | 4/1986 | O'Connor |
| 4,593,719 A | 6/1986 | Leonard et al. |
| 4,628,576 A | 12/1986 | Giachino et al. |
| 4,647,013 A | 3/1987 | Giachino et al. |
| 4,661,835 A | 4/1987 | Gademann et al. |
| 4,687,419 A | 8/1987 | Suzuki et al. |
| 4,772,935 A | 9/1988 | Lawler et al. |
| 4,821,997 A | 4/1989 | Zdeblick |
| 4,824,073 A | 4/1989 | Zdeblick |
| 4,826,131 A | 5/1989 | Mikkor |
| 4,828,184 A | 5/1989 | Gardner et al. |
| 4,869,282 A | 9/1989 | Sittler et al. |
| 4,919,749 A | 4/1990 | Mauger et al. |
| 4,938,742 A | 7/1990 | Smits |
| 4,943,032 A | 7/1990 | Zdeblick |
| 4,946,350 A | 8/1990 | Suzuki et al. |
| 4,959,581 A | 9/1990 | Dantlgraber |
| 4,966,646 A | 10/1990 | Zdeblick |
| 5,000,009 A | 3/1991 | Clanin |
| 5,029,805 A | 7/1991 | Albarda et al. |
| 5,037,778 A | 8/1991 | Stark et al. |
| 5,050,838 A | 9/1991 | Beatty et al. |
| 5,054,522 A | 10/1991 | Kowanz et al. |
| 5,058,856 A | 10/1991 | Gordon et al. |
| 5,061,914 A | 10/1991 | Busch et al. |
| 5,064,165 A | 11/1991 | Jerman |
| 5,065,978 A | 11/1991 | Albarda et al. |
| 5,066,533 A | 11/1991 | America et al. |
| 5,069,419 A | 12/1991 | Jerman |
| 5,074,629 A | 12/1991 | Zdeblick |
| 5,082,242 A | 1/1992 | Bonne et al. |
| 5,096,643 A | 3/1992 | Kowanz et al. |
| 5,116,457 A | 5/1992 | Jerman |
| 5,131,729 A | 7/1992 | Wetzel |
| 5,133,379 A | 7/1992 | Jacobsen et al. |
| 5,142,781 A | 9/1992 | Mettner et al. |
| 5,161,774 A | 11/1992 | Engelsdorf et al. |
| 5,169,472 A | 12/1992 | Goebel |
| 5,176,358 A | 1/1993 | Bonne et al. |
| 5,177,579 A | 1/1993 | Jerman |
| 5,178,190 A | 1/1993 | Mettner |
| 5,179,499 A | 1/1993 | MacDonald et al. |
| 5,180,623 A | 1/1993 | Ohnstein |
| 5,197,517 A | 3/1993 | Perera |
| 5,209,118 A | 5/1993 | Jerman |
| 5,215,244 A | 6/1993 | Buchholz et al. |
| 5,216,273 A | 6/1993 | Doering et al. |
| 5,217,283 A | 6/1993 | Watanabe |
| 5,222,521 A | 6/1993 | Kihlberg |
| 5,238,223 A | 8/1993 | Mettner et al. |
| 5,244,537 A | 9/1993 | Ohnstein |
| 5,267,589 A | 12/1993 | Watanabe |
| 5,271,431 A | 12/1993 | Mettner et al. |
| 5,271,597 A | 12/1993 | Jerman |
| 5,309,943 A | 5/1994 | Stevenson et al. |
| 5,323,999 A | 6/1994 | Bonne et al. |
| 5,325,880 A | 7/1994 | Johnson et al. |
| 5,333,831 A | 8/1994 | Barth et al. |
| 5,336,062 A | 8/1994 | Richter |
| 5,355,712 A | 10/1994 | Petersen et al. |
| 5,368,704 A | 11/1994 | Madou et al. |
| 5,375,919 A | 12/1994 | Furuhashi |
| 5,400,824 A | 3/1995 | Gschwendtner et al. |
| 5,417,235 A | 5/1995 | Wise et al. |
| 5,445,185 A | 8/1995 | Watanabe et al. |
| 5,458,405 A | 10/1995 | Watanabe |
| 5,543,349 A | 8/1996 | Kurtz et al. |
| 5,553,790 A | 9/1996 | Findler et al. |
| 5,566,703 A | 10/1996 | Watanabe et al. |
| 5,577,533 A | 11/1996 | Cook, Jr. |
| 5,589,422 A | 12/1996 | Bhat |
| 5,611,214 A | 3/1997 | Wegeng et al. |
| 5,785,295 A | 7/1998 | Tsai |
| 5,810,325 A | 9/1998 | Carr |
| 5,838,351 A | 11/1998 | Weber |
| 5,848,605 A | 12/1998 | Bailey et al. |
| 5,856,705 A | 1/1999 | Ting |
| 5,873,385 A | 2/1999 | Bloom et al. |
| 5,908,098 A | 6/1999 | Gorman et al. |
| 5,909,078 A | 6/1999 | Wood et al. |
| 5,926,955 A | 7/1999 | Kober |
| 5,941,608 A | 8/1999 | Campau et al. |
| 5,954,079 A | 9/1999 | Barth et al. |
| 5,955,817 A | 9/1999 | Dhuler et al. |
| 5,970,998 A | 10/1999 | Talbot et al. |
| 5,994,816 A | 11/1999 | Dhuler et al. |
| 6,019,437 A | 2/2000 | Barron et al. |
| 6,023,121 A | 2/2000 | Dhuler et al. |
| 6,038,928 A | 3/2000 | Maluf et al. |
| 6,041,650 A | 3/2000 | Swindler et al. |
| 6,096,149 A | 8/2000 | Hetrick et al. |
| 6,105,737 A | 8/2000 | Weigert et al. |
| 6,114,794 A | 9/2000 | Dhuler et al. |
| 6,116,863 A | 9/2000 | Ahn et al. |
| 6,123,316 A | 9/2000 | Biegelsen et al. |
| 6,124,663 A | 9/2000 | Haake et al. |
| 6,171,972 B1 | 1/2001 | Mehregany et al. |
| 6,182,742 B1 | 2/2001 | Takahashi et al. |
| 6,224,445 B1 | 5/2001 | Neukermans et al. |
| 6,255,757 B1 | 7/2001 | Dhuler et al. |
| 6,279,606 B1 | 8/2001 | Hunnicutt et al. |
| 6,283,441 B1 | 9/2001 | Tian |
| 6,318,101 B1 | 11/2001 | Pham et al. |
| 6,321,549 B1 | 11/2001 | Reason et al. |
| 6,386,507 B2 | 5/2002 | Dhuler et al. |
| 6,390,782 B1 | 5/2002 | Booth et al. |
| 6,408,876 B1 | 6/2002 | Nishimura et al. |
| 6,494,804 B1 | 12/2002 | Hunnicutt et al. |
| 6,505,811 B1 | 1/2003 | Barron et al. |
| 6,520,197 B2 | 2/2003 | Deshmukh et al. |
| 6,523,560 B1 | 2/2003 | Williams et al. |
| 6,533,366 B1 | 3/2003 | Barron et al. |
| 6,540,203 B1 | 4/2003 | Hunnicutt |
| 6,581,640 B1 | 6/2003 | Barron |
| 6,637,722 B2 | 10/2003 | Hunnicutt |
| 6,662,581 B2 | 12/2003 | Hirota et al. |
| 6,694,998 B1 | 2/2004 | Hunnicutt |
| 6,724,718 B1 | 4/2004 | Shinohara et al. |
| 6,755,761 B2 | 6/2004 | Hunnicutt et al. |
| 6,761,420 B2 | 7/2004 | Maluf et al. |
| 6,845,962 B1 | 1/2005 | Barron et al. |
| 6,857,501 B1 * | 2/2005 | Han et al. .................. 181/158 |
| 6,872,902 B2 | 3/2005 | Cohn et al. |
| 6,902,988 B2 | 6/2005 | Barge et al. |
| 6,958,255 B2 | 10/2005 | Khuri-Yakub et al. |
| 6,966,329 B2 | 11/2005 | Liberfarb |
| 7,011,378 B2 | 3/2006 | Maluf et al. |
| 7,063,100 B2 | 6/2006 | Liberfarb |
| 7,210,502 B2 | 5/2007 | Fuller et al. |
| 7,372,074 B2 | 5/2008 | Milne et al. |

(56) References Cited

U.S. PATENT DOCUMENTS

| | | |
|---|---|---|
| 7,449,413 B1 | 11/2008 | Achuthan et al. |
| 7,528,689 B2 | 5/2009 | Lee et al. |
| 8,113,448 B2 | 2/2012 | Keating |
| 8,113,482 B2 | 2/2012 | Hunnicutt |
| 8,156,962 B2 | 4/2012 | Luckevich |
| 2002/0014106 A1 | 2/2002 | Srinivasan et al. |
| 2002/0029814 A1 | 3/2002 | Unger et al. |
| 2002/0096421 A1 | 7/2002 | Cohn et al. |
| 2002/0100714 A1 | 8/2002 | Staats |
| 2002/0174891 A1 | 11/2002 | Maluf et al. |
| 2003/0034535 A1* | 2/2003 | Barenburg et al. .......... 257/415 |
| 2003/0061889 A1 | 4/2003 | Tadigadapa et al. |
| 2003/0096081 A1 | 5/2003 | Lavallee et al. |
| 2003/0098612 A1 | 5/2003 | Maluf et al. |
| 2003/0159811 A1 | 8/2003 | Nurmi |
| 2003/0206832 A1 | 11/2003 | Thiebaud et al. |
| 2004/0115905 A1 | 6/2004 | Barge et al. |
| 2005/0121090 A1 | 6/2005 | Hunnicutt |
| 2005/0200001 A1 | 9/2005 | Joshi et al. |
| 2005/0205136 A1 | 9/2005 | Freeman |
| 2006/0017125 A1 | 1/2006 | Lee et al. |
| 2006/0067649 A1 | 3/2006 | Tung et al. |
| 2006/0110904 A1 | 5/2006 | Conrad |
| 2006/0218953 A1 | 10/2006 | Hirota |
| 2007/0082420 A1* | 4/2007 | Milne et al. ................ 438/48 |
| 2007/0251586 A1 | 11/2007 | Fuller et al. |
| 2007/0289941 A1 | 12/2007 | Davies |
| 2008/0028779 A1 | 2/2008 | Song |
| 2008/0042084 A1 | 2/2008 | Fuller |
| 2008/0072977 A1 | 3/2008 | George et al. |
| 2008/0229770 A1 | 9/2008 | Liu |
| 2008/0271788 A1 | 11/2008 | Matsuzaki et al. |
| 2009/0123300 A1 | 5/2009 | Uibel |
| 2009/0186466 A1 | 7/2009 | Brewer |
| 2010/0019177 A1 | 1/2010 | Luckevich |
| 2010/0038576 A1 | 2/2010 | Hunnicutt |
| 2010/0065946 A1* | 3/2010 | Wilson .................... 257/618 |
| 2010/0204840 A1 | 8/2010 | Sun et al. |
| 2010/0225708 A1 | 9/2010 | Peng et al. |
| 2012/0000550 A1 | 1/2012 | Hunnicutt et al. |

FOREIGN PATENT DOCUMENTS

| | | |
|---|---|---|
| DE | 3401404 | 7/1985 |
| DE | 4101575 | 7/1992 |
| DE | 4417251 | 11/1995 |
| DE | 4422942 | 1/1996 |
| EP | 250948 | 1/1988 |
| EP | 261972 | 3/1988 |
| EP | 1024285 | 8/2000 |
| GB | 2238267 | 5/1991 |
| JP | SHO 39-990 | 2/1964 |
| JP | 04-000003 | 1/1992 |
| JP | 06-117414 | 4/1994 |
| JP | 2000-187041 | 7/2000 |
| JP | 2001184125 | 7/2001 |
| JP | 2001-281265 | 10/2001 |
| JP | 2003-049933 | 2/2003 |
| JP | SHO 63-148062 | 7/2003 |
| JP | 2006-080194 | 3/2006 |
| WO | 99/16096 A1 | 4/1999 |
| WO | 99/24783 A1 | 5/1999 |
| WO | 00/14415 A2 | 3/2000 |
| WO | 00/14415 A3 | 7/2000 |
| WO | 2005/084211 A2 | 9/2005 |
| WO | 2005/084211 A3 | 1/2006 |
| WO | 2006/076386 A1 | 7/2006 |
| WO | 2008/076388 A1 | 6/2008 |
| WO | 2008/076388 B1 | 8/2008 |
| WO | 2008/121365 A1 | 10/2008 |
| WO | 2008/121369 A1 | 10/2008 |
| WO | 2010/019329 A2 | 2/2010 |
| WO | 2010/019329 A3 | 2/2010 |
| WO | 2010/019665 A2 | 2/2010 |
| WO | 2010/019665 A3 | 2/2010 |
| WO | 2010/065804 A2 | 6/2010 |
| WO | 2010/065804 A3 | 6/2010 |
| WO | 2011/022267 A2 | 2/2011 |
| WO | 2011/022267 A3 | 2/2011 |
| WO | 2011/094300 A2 | 8/2011 |
| WO | 2011/094300 A3 | 8/2011 |
| WO | 2011/094302 A2 | 8/2011 |
| WO | 2011/094302 A3 | 8/2011 |

OTHER PUBLICATIONS

PCT International Search Report, Application No. PCT/US2011/022565 filed Jan. 26, 2011, dated Sep. 27, 2011. AM0036.

Ayon et al., "Etching Characteristics and Profile Control in a Time Multiplexed ICP Etcher," Proc. of Solid State Sensor and Actuator Workshop Technical Digest, Hilton Head SC, (Jun. 1998) 41-44.

Bachmann, Stephan, "Electronic Expansion Valves: Fitters Notes (Part 8)", Danfoss Fitters Notes, Jul. 2008.

Bartha et al., "Low Temperature Etching of Si in High Density Plasma Using SF6/02," Microelectronic Engineering, and Actuator Workshop Technical Digest, Hilton Head SC, (Jun. 1998) 41-44.

Biography, Ohio State University Website [online], [retrieved Dec. 31, 2000]. Retrieved from the Internet <URL: http://www.chemistry.ohio-state.edu/resource/pubs/brochure/madou.htm>.

Booth, Steve and Kaina, Rachid, Fluid Handling—Big Gains from Tiny Valve, Appliance Design (Apr. 2008), pp. 46-48.

Changenet et al., "Study on predictive functional control of an expansion valve for controlling the evaporator superheat", Proc.IMechE vol. 222 Part I, May 28, 2008, pp. 571-582.

Controls Overview for Microstaq Silicon Expansion Valve (SEV), Rev. 1, Dec. 2008 [online], [retrieved May 17, 2010]. Retrieved from the Internet <URL: http://www.microstaq.com/pdf/SEV_controls.pdf>.

Copeland, Michael V., Electronic valves promise big energy savings, Fortune, Sep. 9, 2008 [online], [retrieved Sep. 9, 2008]. Retrieved from the internet <URL: http://techland.blogs.fortune.cnn.com/2008/09/09/electronic-valves-promise-big-energy-savings>.

Fung et al., "Deep Etching of Silicon Using Plasma" Proc. of the Workshop on Micromachining and Micropackaging of Transducers, (Nov. 7-8, 1984) pp. 159-164.

Gui, C. et al, "Selective Wafer Bonding by Surface Roughness Control", Journal of The Electrochemical Society, 148 (4) G225-G228 (2001).

Gui, C. et al., "Fusion bonding of rough surfaces with polishing technique for silicon micromachining", Microsystem Technologies (1997) 122-128.

Günther, Götz, "Entwicklung eines pneumatischen 3/2-Wege-Mikroventils", O + P Olhydraulik Und Pneumatik, Vereinigte Fachverlage, Mainz, DE, vol. 42, No. 6, Jun. 1, 1998, pp. 396-398, XP000831050, ISSN: 0341-2660.

Higginbotham, Stacey, Microstaq's Tiny Valves Mean Big Energy Savings [online], [retrieved Dec. 8, 2008]. Retrieved from the Internet <URL: http//earth2tech.com/2008/09/09/microstaqs-tiny-valves-mean-big-energysavings (posted Sep. 9, 2008)>.

J. Mark Noworolski, et al.,"Process for in-plane and out-of-plane single-crystal-silicon thermal microactuators", Sensors and Actuators A 55 (1996); pp. 65-69.

Jonsmann et al., "Compliant Electra-thermal Microactuators", IEEE Technical Digest , Twelfth IEEE International Conference on Micro Electro Mechanical Systems Jan. 17-21, 1999, Orlando, Florida, pp. 588-593, IEEE Catalog No. 99CH36291C.

K.R. Williams et al., "A Silicon Microvalve for the Proportional Control of Fluids", Transducers '99, Proc. 10th International Conference on Solid State Sensors and Actuators, held Jun. 7-10, 1999, Sendai, Japan, pp. 18-21.

Keefe, Bob, Texas firm says value-replacing chip can drastically cut energy use, Atlanta Metro News, Sep. 10, 2008 [online], [retrieved Sep. 10, 2008]. Retrieved from the Internet <URL: http://www.ajc.com/search/content/shared/money/stories/2008/09/microstaq10_cox-F9782.html>.

Klaassen et al., "Silicon Fusion Bonding and Deep Reactive Ion Etching; A New Technology for Microstructures," Proc., Transducers 95 Stockholm Sweden, (1995) 556-559.

(56) References Cited

OTHER PUBLICATIONS

Linder et al., "Deep Dry Etching Techniques as a New IC Compatible Tool for Silicon Micromachining," Proc, Transducers, vol. 91, (Jun. 1991) pp. 524-527.

Luckevich, Mark, MEMS microvlaves: the new valve world, Valve World (May 2007), pp. 79-83.

Madou, Marc, "Fundamentals of Microfabrication", Boca Raton: CRC Press, 1997, 405-406.

MEMS, Microfluidics and Microsystems Executive Review [online], Posted Apr. 16, 2009. [retrieved May 17, 2010]. Retrieved from the Internet <URL: http:www.memsinvestorjournal.com/2009/04/mems-applications-for-flow-control-.html>.

Microstaq Announces High Volume Production of MEMS-Based Silicon Expansion Valve [onlne], [retrieved Jan. 27, 2010]. Retrieved from the Internet <URL: http://www.earthtimes.org/articles/printpressstory.php?news+1138955 (posted Jan. 27, 2010)>.

Microstaq Product Descriptions, SEV, CPS-4, and PDA-3 [online], Published 2009, [retrieved May 17, 2010]. Retrieved from the Internet <URL: http://www.microstaq.com/products/index.html>.

Microstaq Product Description, Proportional Piloted Silicon Control Valve (CPS-4) [online], Published 2008, [retrieved May 17, 2010]. Retrieved from the Internet <URL: http://www.microstaq.com/products/cps4.html>.

Microstaq Product Description, Proportional Direct Acting Silicon Control Valve (PDA-3) [online], Published 2008, [retrieved May 17, 2010]. Retrieved from the Internet <URL: http://www.microstaq.com/products/pda3.html>.

Microstaq Technology Page [online], Published 2008, [retrieved May 17, 2010]. Retrieved from the Internet <URL: http://www.microstaq.com/technology/index.html>.

Petersen et al. "Surfaced Micromachined Structures Fabricated with Silicon Fusion Bonding" Proc., Transducers 91, (Jun. 1992) pp. 397-399.

Press Release, Freescale and Microstaq Join Forces on Smart Superheat Control System for HVAC and Refrigeration Efficiency (posted Jan. 22, 2008) [online], [retrieved May 17, 2010]. Retrieved from the Internet <URL: http://www.microstaq.com/pressReleases/prDetail__04.html>.

Press Release, Microstaq Unveils Revolutionary Silicon Expansion Valve at Demo 2008 [online], [retrieved May 17, 2010]. Retrieved from the Internet <URL: http://www.microstaq.com/pressReleases/prDetail__05.html (posted Sep. 8, 2008)>.

Press Release, Microstaq Mastering Electronic Controls for Fluid-Control Industry (posted May 5, 2005) [online[, [retrieved May 17, 2010]. Retrieved from the Internet <URL: http://www.microstaq.com/pressReleases/prDetail__02.html>.

Press Release, Nanotechnology Partnerships, Connections Spur Innovation for Fluid Control Industries (posted Jun. 9, 2005) [online], [retrieved May 17, 2010]. Retrieved from the Internet <URL: http://www.microstaq.com/pressReleases/prDetail__03.html>.

Product Review, greentechZONE Products for the week of May 18, 2009 [online], [retrieved May 17, 2010]. Retrieved from the Internet <URL: http://www.en-genius.net/site/zones/greentechZONE/product__reviews/grnp__051809>.

SEV Installation Instructions [online], [retrieved May 17, 2010]. Retrieved from the Internet <URL: http://www.microstaq.com/pdf/SEV__Instruction__sheet.pdf>.

Silicon Expansion Valve Information Sheet [online], [retrieved May 17, 2010]. Retrieved from the Internet <URL: http://www.microstaq.com/pdf/SEV__Infosheet__2__0.pdf>.

Silicon Expansion Valve (SEV)—For Heating, Cooling, and Refrigeration Applications [online], [retrieved May 17, 2010]. Retrieved from the Internet <URL: http://www.microstaq.com/pdf/SEV__Quicksheet.pdf>.

Silicon Expansion Valve Data Sheet [online], [retrieved May 17, 2010]. Retrieved from the Internet <URL: http://www.microstaq.com/pdf/SEV__Datasheet__1__8.pdf>.

SMIC Announces Successful Qualification of a MEMS Chip for Microstaq (posted Oct. 26, 2009) [online], [retrieved May 17, 2010]. Retrieved from the Internet <URL: http://www.prnewswire.com/news-releases/smic-announces-successful-qualification-of-a-mems-chip-for-microstaq-65968252.html (posted Oct. 26, 2009)>.

SMIC quals Microstaq MEMS chip for fluid control (posted Oct. 26, 2009) [online], [retrieved May 17, 2010]. Retrieved from the Internet <URL: http://www.electroiq.com/ElectroiQ/en-us/index/display/Nanotech__Article__Tools__Template.articles.small-times.nanotechmems.mems.microfluidics.2009.10.smic-quals__microstaq.html>.

Tiny Silicon Chip Developed by Microstaq Will Revolutionize Car Technology (posted May 19, 2005) [online], [retrieved May 19, 2005]. Retrieved from the Internet <URL: http://www.nsti.org/press/PRshow.html?id=160>.

Turpin, Joanna R., Soft Economy, Energy Prices Spur Interest in Technologies [online], Published Dec. 8, 2008. [retrieved May 18, 2010]. Retrieved from the Internet <URL: http://www.achrnews.com/copyright/BNP__GUID__9-5-2006__A__10000000000000483182>.

Uibel, Jeff, The Miniaturization of Flow Control (Article prepared for the 9th International Symposium on Fluid Control Measurement and Visualization (FLUCOME 2007)), Journal of Visualization (vol. 11, No. 1, 2008), IOS Press.

Yunkin et al., "Highly Anisotropic Selective Reactive Ion Etching of Deep Trenches in Silicon," Microelectronic Engineering, Elsevier Science B.V., vol. 23, (1994) pp. 373-376.

Zhixiong Liu et al., "Micromechanism fabrication using silicon fusion bonding", Robotics and Computer Integrated Manufacturing 17 (2001) 131-137.

* cited by examiner

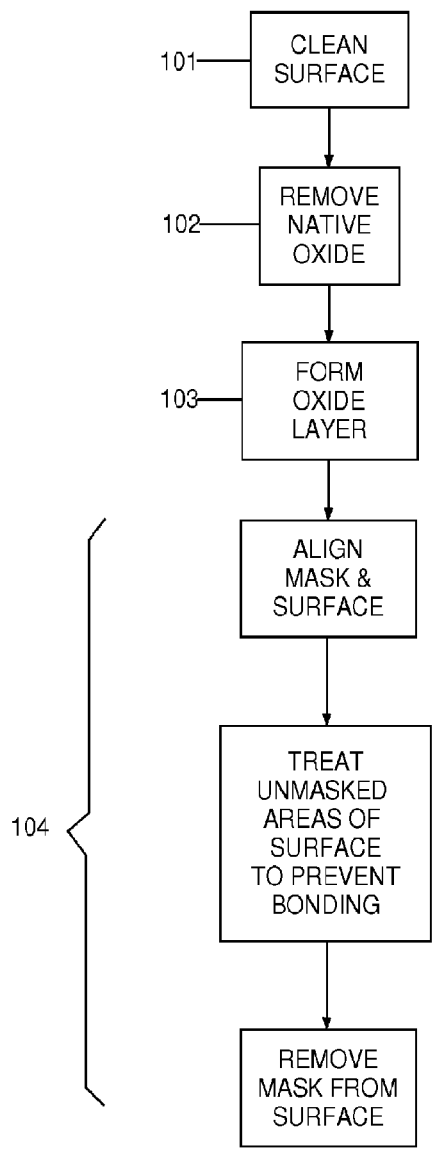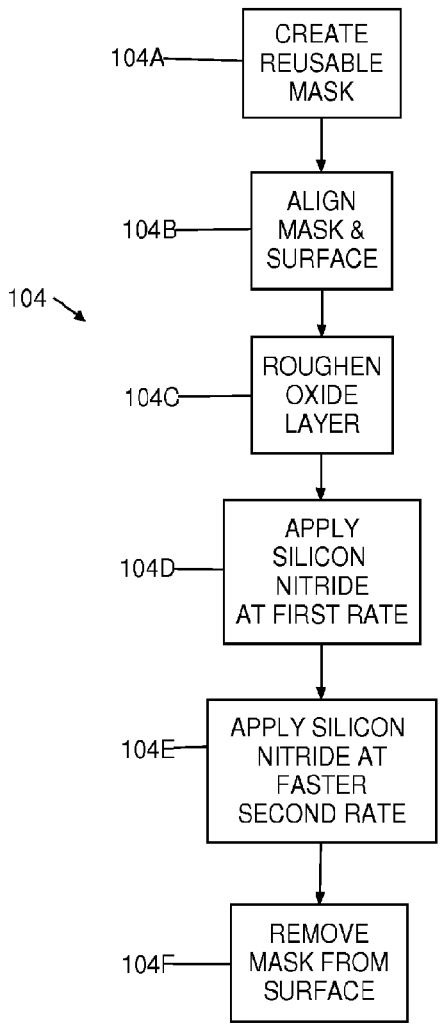
FIG. 2                    FIG. 3

PROCESS AND STRUCTURE FOR HIGH TEMPERATURE SELECTIVE FUSION BONDING

BACKGROUND OF THE INVENTION

This invention relates in general to valves and to semiconductor electromechanical devices, and in particular, to micromachined components formed from wafers of a semiconductor material, such as silicon, bonded together.

MEMS (micro electro mechanical systems) are a class of systems that are physically small, having features or clearances with sizes in the micrometer range or smaller (i.e., smaller than about 10 microns; as is well known, "micron" is another term for micrometer, a unit of length equal to 0.001 millimeter). These systems have both electrical and mechanical components. The term "micro machining" is commonly understood to mean the production of three-dimensional structures and moving parts of MEMS devices. MEMS originally used modified integrated circuit (e.g., computer chip) fabrication techniques (such as chemical etching) and materials (such as silicon semiconductor material) to micro machine these very small mechanical devices. Today there are many more micro machining techniques and materials available. The term "MEMS device" as may be used in this application means a device that includes a micro machined component having features or clearances with sizes in the micrometer range, or smaller (i.e., smaller than about 10 microns). It should be noted that if components other than the micro machined component are included in the MEMS device, these other components may be micro machined components or standard sized (i.e., larger) components. Similarly, the term "microvalve" as may be used in this application means a valve having features or clearances with sizes in the micrometer range, or smaller (i.e., smaller than about 10 microns) and thus by definition is at least partially formed by micro machining. The term "microvalve device" as may be used in this application means a device that includes a microvalve, and that may include other components. It should be noted that if components other than a microvalve are included in the microvalve device, these other components may be micro machined components or standard sized (i.e., larger) components.

Many MEMS devices may be made of multiple wafers (or plates) of material, which may be micromachined to form components of the MEMS device prior to assembly of the multiple wafers into a completed MEMS device. For example, such a MEMS device may be manufactured using suitable MEMS fabrication techniques, such as the fabrication techniques disclosed in U.S. Pat. No. 6,761,420, the disclosures of which are incorporated herein by reference; U.S. Pat. No. 7,367,359, the disclosures of which are incorporated herein by reference; Klassen, E. H. et al. (1995), "Silicon Fusion Bonding and Deep Reactive Ion Etching: A New Technology for Miscrostructures," Proc. Transducers 95 Stockholm Sweden pp. 556-559, the disclosures of which are incorporated herein by reference; and Petersen, K. E. et al. (June 1991), "Surface Micromachined Structures Fabricated with Silicon Fusion Bonding," Proc. Transducers 91 pp. 397-399, the disclosures of which are incorporated herein by reference.

SUMMARY OF THE INVENTION

The invention relates to a method to prevent movable structures within a MEMS device from being inadvertently bonded to non-moving structures during a bonding process. The method includes surface preparation of silicon to aid in preventing movable structures from bonding to adjacent surfaces during bonding of other surfaces, including during high force, high temperature fusion bonding.

Various aspects of this invention will become apparent to those skilled in the art from the following detailed description of the preferred embodiment, when read in light of the accompanying drawings.

BRIEF DESCRIPTION OF THE DRAWINGS

FIG. 2 is a flow chart illustrating a method for preparing a surface for selective fusion bonding.

FIG. 3 is a flow chart providing detail of a step of the method of FIG. 2.

DETAILED DESCRIPTION OF THE PREFERRED EMBODIMENT

Figure 1:
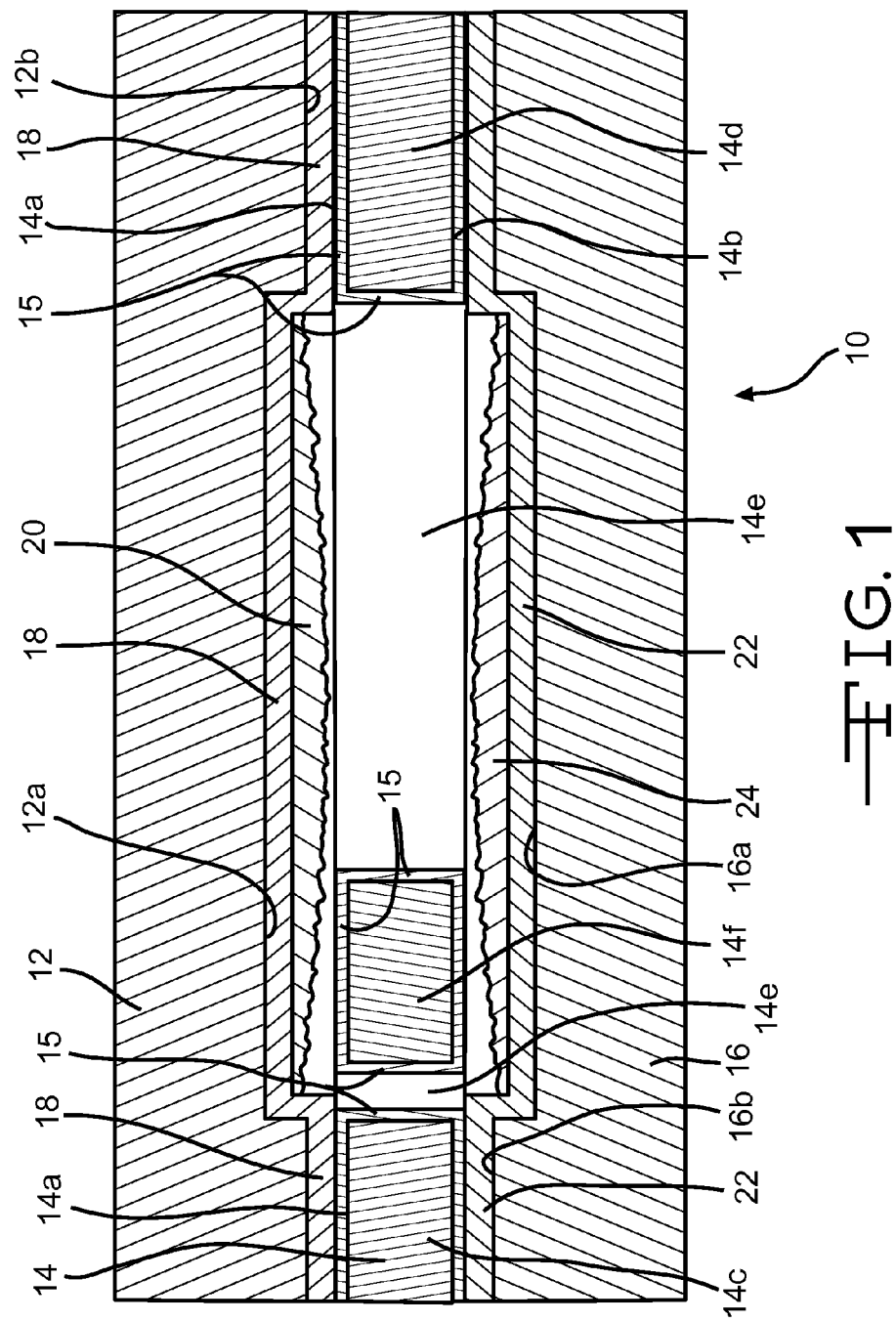
FIG. 1 is a non-scale cross-sectional view of a MEMS device.

Preliminarily, it should be noted that certain terms used herein, such as "upper", "lower", "middle", "upward", "downward", "top", "bottom", "front", "back", and "side", are used to facilitate the description of the preferred embodiment of the invention. Unless otherwise specified or made apparent by the context of the discussion, such terms should be interpreted with reference to the figure under discussion. Such terms are not intended as a limitation on the orientation in which the components of the invention may be used.

Referring now to the drawings, there is illustrated in FIG. 1 a portion of a first component, indicated generally at 10. The component 10 is a MEMS device with a portion that moves (actuates) relative to other, fixed portions, such as may be found in a microvalve, a micromachined sensor, or a micromachined optical switch. In the illustrated embodiment, the component 10 is formed from three wafers of single crystal silicon, including (as viewed with reference to FIG. 1) an upper wafer 12, a middle wafer 14, and a lower wafer 16.

The upper wafer 12 has a recess 12a formed in a lower surface 12b thereof. A thermal silicon dioxide layer 18 is fixed to the lower surface 12b, including the upper surface of the recess 12a. As will be explained further below, a silicon nitride layer 20 is deposited on the thermal silicon dioxide layer 18 in the recess 12a; preferably the silicon nitride layer 20 is a Plasma-Enhanced Chemical Vapor Deposition (PECVD). The PECVD silicon nitride layer 20 has non-uniform distribution within the recess 12a, as will be further explained below, and is preferably provided with relatively high surface roughness (sufficiently rough to prevent fusion bonding with a silicon component in contact with the rough surface—in a preferred embodiment, the surface roughness of the silicon nitride layer 20 within the recess 12a may be greater than about 3 Angstroms RMS, for reasons which will also be explained below. Non-recessed portions of the lower surface 12b are bonded via the thermal silicon dioxide layer 18 to portions of an upper surface 14a of the middle wafer 14, with the recess 12a disposed adjacent to the middle wafer 14.

Similarly, the lower wafer 16 has a recess 16a formed in an upper surface 16b thereof. A second thermal silicon dioxide layer 22 is fixed to the upper surface 16b, including the lower surface of the recess 16a. As will be explained further below, a second PECVD silicon nitride layer 24 is deposited on the thermal silicon dioxide layer 18 in the recess 16a. The PECVD silicon nitride layer 24 has non-uniform distribution within the recess 16a, as will be further explained below, and is preferably formed with relatively high surface roughness (a surface with "relatively high surface roughness" as used in this disclosure is defined as a surface that is sufficiently rough to substantially prevent fusion bonding between the surface and a silicon component in contact with the rough surface), for reasons which will also be explained below. In a preferred embodiment, the surface roughness of the silicon nitride layer 24 within the recess 16a may be greater than 3 Angstroms RMS. Non-recessed portions of the upper surface 16b are bonded via the second thermal silicon dioxide layer 22 to portions of a lower surface 14b of the middle wafer 14, with the recess 16a disposed adjacent to the middle wafer 14.

The middle wafer 14 has fixed portions 14c and 14d that do not move relative to the upper wafer 12 or the lower wafer 16. The middle wafer 14 also has one or more cuts 14e micromachined through the middle wafer 14 so as to define a movable portion 14f of the middle wafer 14, in the region between the recess 12a and the recess 16a. When the movable portion 14f is spaced apart from the material above and below the movable portion 14f (i.e., the thermal silicon dioxide layer 18 and the PECVD silicon nitride layer 20 fixed to the upper wafer 12, and the thermal silicon dioxide layer 22 and the PECVD silicon nitride layer 24 fixed to the lower wafer 16) then the movable portion 14f is able to move relative to the fixed portions 14c and 14d of the middle wafer 14, as well as the upper wafer 12 and the lower wafer 16. Respective conformal thin silicon dioxide layers 15 are formed on surfaces of the middle wafer 14.

During the process of fusion bonding of the upper wafer 12, the middle wafer 14, and the bottom wafer 16, pressure and heat may be applied to the wafers to facilitate the formation of a high bond strength bond, a process that may induce stresses in the wafers. The stresses that may be set up can cause the movable portion 14f to move out of the plane of the middle wafer 14, and contact either the silicon nitride layer 20 in the bottom of recess 12a or the silicon nitride layer 24 in the bottom of the recess 16a. If the silicon nitride layer 20, 24 in bottom of the recess 12a, 16a and the moveable portion 14f were sufficiently smooth, the part of the movable portion 14f contacting the bottom of the recess 12a, 16a might form a bond at the point of contact with the bottom of the recess 12a, 16a while heated during the bonding process. However, as indicated above, the PECVD silicon nitride layers 20, 24 are deposited such that the surfaces of the PECVD silicon nitride layers 20, 24 have relatively high surface roughness, i.e., sufficiently rough that fusion bonding (which generally requires very smooth, flat surfaces in intimate contact with each other to create a bond) will not occur between the movable portion 14f and any point of contact of the movable portion 14f with the PECVD silicon nitride layers 20, 24.

Furthermore, there may be residual stresses existing after the bonding process that may cause the movable portion 14f to be urged out of the plane of the middle wafer 14 following a post-bonding high temperature annealing step, for example. Post-bonding high temperature annealing may desirably improve the bond strength between wafers, thus enabling fluidic MEMS devices, for example, to withstand increased internal pressures. The recesses 12a and 16a may permit some out of plane movement of the movable portion 14f, but it may not be desirable to leave a large clearance between the movable portion 14f and the components immediately above and below the movable portion 14f. An example of this is a fluidic MEMS device such as a microvalve, where excessive clearance between the movable portion 14 and the non-moving components immediately above and below may result in excessive leakage past a closed valve.

To prevent excessive clearances, during construction of the component 10, one preferred method of construction is to deeply etch the recess 12a in the upper wafer 12 and the recess 16a in the lower wafer 16, then fill the recesses 12a and 16a with, first, their respective silicon dioxide layers 18, 22, and then build up the PECVD silicon nitride layers 20, 24 to create the desired clearance from the movable portion 14f.

However, with relatively small clearances, residual stress in the component 10 may leave the movable portion 14f in contact with the PECVD silicon nitride layers 20, 24 after the component 10 is cooled following bonding and annealing. However, in a preferred embodiment the upper and lower surfaces of the movable portion 14f are smooth, and the rough PECVD silicon nitride layers 20, 24 are relatively hard and wear resistant, so that the movable portion 14f will normally ride smoothly on the highpoints of the rough PECVD silicon nitride layer 20 or 24 with which the movable portion 14f is in contact, with little sliding resistance.

General steps of preparing the surfaces of the wafers 12, 14, and 16 forming the component 10 in accordance with a preferred method for selective fusion bonding are described below with respect to FIGS. 2 and 3. Various temperatures, time durations, etc., are given in the following description; these should be considered starting point values. As one of ordinary skill in the art will recognize, adjustments to the starting point values of temperature and time duration indicated below may be required based on experience in a particular fabrication line to account for various environmental factors, feedstock qualities, etc.

In a first step 101, the surfaces are cleaned of organics. The first step 101 includes a first sub-step of cleaning the surfaces using a first cleaning solution of 1:4:20 $NH_4OH:H2O2:H2O$ (1 part Ammonium hydroxide, 4 parts Hydrogen Peroxide, and 20 parts Water), at about 70° C., for about 10 minutes to facilitate removal of organics. It is contemplated that alternate solutions with other ratios of constituent chemicals, and indeed different chemicals, may be utilized to facilitate removal of organics, as different organic materials may respond differently to such alternate solutions.

The first step 101 also includes a second sub-step, rinse the surface using DI water (Deionized water), preferably in a dump rinse, for about 10 minutes.

In a second step 102, the native oxide is removed from the surfaces of the component 10. In a first sub-step of step 102, clean the surfaces using a second cleaning solution of 1:100 $HF:H_2O$ (1 part Hydrogen fluoride and 100 parts Water) at about 25° C., for about 5 minutes to facilitate removal of native oxide. It is contemplated that alternate solutions with other ratios of constituent chemicals, and indeed different chemicals, may be utilized to facilitate removal native oxide.

In a second sub-step of the step 102, rinse the surfaces using DI water (Deionized water), preferably in a dump rinse, for about 10 minutes.

In a third sub-step of the step 102, soak the surfaces in fresh IPA (isopropyl alcohol) about for 5 minutes.

In a fourth sub-step of the step 102, dry the surfaces at room temperature for about 15 minutes or furnace dry the component 10 at about 56° C. for about 6 minutes.

In a third step 103, an oxide layer 15, 18, 22 is formed on the surface of the wafer, to promote bonding during a later fusion bonding process. The type of oxide layer to be formed depends on the type of wafer on which the oxide layer is being formed. For the cover wafers (the upper wafer 12 and the lower wafer 16), a thermal silicon dioxide layer 18, 22 of perhaps 2000 to 3000 Angstroms in thickness is grown utilizing an oxidation furnace (not shown). For the middle wafer 14, which is a bare silicon wafer, a conformal thin silicon dioxide layer 15 is grown utilizing nitric acid (HNO3) to promote formation of an oxide-monolayer. The conformal thin silicon dioxide layer 15 may be generally considered an oxide monolayer.

Initially the third step 103 will be described with respect to processing of the middle wafer 14: In a first sub-step of the third step 103, apply HNO3 at about 70° C. to about 110° C., for about 15 minutes for promotion of a hydrous chemical oxide, the conformal thin silicon dioxide layer 15.

In a second sub-step of the step 103, rinse the surfaces using DI water (Deionized water), preferably in a dump rinse, for about 10 minutes.

In a third sub-step of the step 103, soak the surfaces in fresh IPA (isopropyl alcohol) about for 5 minutes.

In a fourth sub-step of the step 103, dry the surfaces of the wafer 14 at room temperature for about 15 minutes or furnace dry the component 10 at about 56° C. for about 6 minutes.

Next with respect to processing of the cover layers 12, 16, the third step 103 may be growing a thermal silicon dioxide layer 18, 22 (of perhaps 2000 to 3000 Angstroms thickness) in an oxidation furnace. The thermal silicon dioxide layers 18 and 22 are grown on, respectively, the lower surface 12b of the upper wafer 12 and the upper surface 16b of the lower wafer 16.

Note: Not all steps are required for all parts of the component 10. The middle wafer 14 (known as a mechanical wafer, since moveable portions 14f are formed in the middle wafer 14) is formed of a bare silicon wafer (there are no oxide layers on the surfaces thereof before fusion bonding occurs. For bare silicon wafers (such as the middle wafer 14), perform the first step 101, the second step 102, and the third step 103 to prepare the bonding interface surfaces of the wafer for fusion bonding.

However, only the first step 101 and the third step 103 need be run to prepare the oxidized silicon wafer surfaces for fusion bonding (such as are found on the bonding interface surfaces of the upper wafer 12 and lower wafer 16—more specifically, the lower surface 12b of the upper wafer 12 and the upper surface 16b of the lower wafer 16).

Oxygen plasma can also be used to promote hydrophilicity of wafer surfaces. However, the tool chamber in which oxygen plasma is utilized should be completely free of contamination.

In a fourth step 104, the upper wafer 12 and the lower wafer 16 are treated to create selective bonding regions.

FIG. 3 is a more detailed look at the fourth step shown in FIG. 2. The creation of a reusable shadow mask, in a sub-step 104A, will normally be preliminary to the actual process, since the shadow mask utilized may have been previously used in the manufacture of other components 10. Assuming that suitable shadow masks had been previously created, then the first sub-step 104B of the step 104 may include aligning the upper wafer 12 and a respective first shadow mask, and securing them in this aligned condition, and may further include aligning the lower wafer 16 and a respective second shadow mask, and securing them in this aligned condition. A preferred method is to use a fixture to align the shadow mask and the wafer 12, 16, and clamps to secure the shadow mask to the silicon wafer 12, 16. The silicon wafer 12, 16, of course, may have been previously micromachined to form features, such as the recesses 12a, 16a. Alternative shadow mask attachment methods may include the use of mechanical fixtures or clamps, utilizing photoresist as a glue layer, utilizing thermally retardant tapes, etc.

Note, in a preferred embodiment, each shadow mask is made from an 8 inch silicon wafer, which is preferably the same size as the upper wafer 12 and the lower wafer 16 for ease of alignment; however, the sizes of the shadow mask, upper wafer 12, and lower wafer 16 may be made otherwise—indeed, as fab technology advances, preferences are expected to change. Furthermore, while this disclosure discusses only one component 10, it will be realized that preferably components for multiple components 10 will be fabricated from each wafer 12, 14, and 16. Preferably, the shadow mask is made out of silicon or metal with laser or chemically etched opening(s) therethrough.

Preferably, the shadow mask wafer is pre-coated with PECVD silicon nitride to avoid bonding between the cover wafer and the shadow mask wafer during alignment. The PECVD silicon nitride coat thickness on the shadow masks are preferably in the range of 500 Angstroms (50 nanometers) to 1000 Angstroms (100 nanometers). Shadow masks can also be created, for example, from LPCVD (Low Pressure Chemical Vapor Deposition) nitride wafers that have gone through an HMDS (Hexamethyldisilazane) oven process.

In FIG. 2, the second sub-step of the step 104 is to treat the unmasked areas of the surface of the cover wafer 12, 16 to prevent fusion bonding to the treated surface. Any suitable treatment may be utilized. For example, silicon nitride is a more difficult surface for a silicon member (for example the movable portion 14f of the middle wafer 14) to fusion bond to than a silicon dioxide surface, for example, and so, compared to the silicon dioxide surface, the silicon nitride surface may be considered to be bonding resistant. Thus, the application of silicon nitride to the unmasked area may be considered a treatment of the unmasked area to prevent bonding. Another treatment, described in more detail below, may be roughening the unmasked areas sufficiently to prevent fusion bonding.

In a third sub-step 104C of the third step 103, after a silicon dioxide layer 18 or 24 is built up, and the shadow mask fixed in position relative to the cover wafers 12, 14, the portion of the silicon dioxide layer 18 or 24 within the recesses 12a or 16a of the cover wafer 12 or 14 may be deliberately roughened as a treatment to decrease the possibility of fusion bonding inside the recesses 18 or 24, respectively. The silicon dioxide layer 18 or 24 is preferably roughened by etching, such as by RF (radiofrequency) based dry etching methods or reactive ion etching.

A sub-step 104D shown in FIG. 3 is a deposition sub-step, and includes inserting a cover wafer (the upper wafer 12 or the bottom wafer 16) and the associated aligned and secured shadow mask into a PECVD nitride tool (process temperature approximately 300° C.-350° C.) and deposit PECVD silicon nitride on the surfaces which are not masked off (i.e., in the recess 12a, 16a). A typical nitride target thickness is 2000 Angstroms-3000 Angstroms. Preferably, the rate of deposition of PECVD silicon nitride to form the silicon nitride layers 20, 24 changes: Initially, in the sub-step 104D, the rate of deposition should be relatively slow rate of deposition (less than about 25 Angstroms per minute, and preferably less than 20 Angstroms per minute) to achieve a thin, but substantially complete coating of the unmasked area. In a second deposition step, the sub-step 104E, the deposition of the PECVD silicon nitride layer 20, 24 into the recess 12a, 16a is preferably finished utilizing a relatively fast rate of deposition (greater than or equal to about 25 Angstroms per minute, and preferably about 50 Angstroms per minute). This relatively fast rate of deposition is used to achieve a relatively rough surface on the resultant nitride layer 20, 24 in the unmasked area. The varying deposition rates of the silicon nitride layer 20, 24 will give good coverage and varying surface roughness on the silicon nitride layer 20, 24. The thickness of the silicon nitride layer 20, 24 is determined by the final desired cavity clearance required between the sandwich structures (i.e., between the surface of the silicon nitride layer 20, 24 and the adjacent movable component 14f of the middle wafer 14. As indicated above, the amount of roughness is that sufficient to prevent fusion bonding with a silicon component (such as a movable portion 14f of the middle wafer 14) if such component comes in contact with the rough surface while the wafers 12, 14, 16 are heated to fusion bond the wafers together—in a preferred embodiment, the surface roughness of the silicon nitride layer 20, 24 within the respective recess 12a, 16a may be greater than 3 Angstroms RMS. The silicon nitride layer 20, 24 is also preferably deposited with a non-uniform distribution pattern. This pattern should achieve the desired cavity clearance at the thickest part of the silicon nitride layer 20, 24. However, the non-uniform distribution pattern should result in the silicon nitride layer 20, 24 being thinner away from the thickest part of the silicon nitride layer 20, 24 so as to minimize friction between a movable portion 14f of the middle wafer 14 and the silicon nitride layer 20, 24. As seen in FIG. 1, in one embodiment the silicon nitride layer 20, 24 is generally thicker in a central portion of the recess 12a, 16a, and thinner elsewhere.

The deposition of PECVD silicon nitride is terminated when the depth of the recess 12a, 16a less (minus) the combined thickness of the silicon nitride layer 20, 24 and the oxide layer (silicon dioxide layer 18, 22) provides a desired cavity clearance. The cavity clearance is the clearance from the silicon nitride layer 20, 24 to an adjacent component (such as the middle wafer 14, particularly, the movable portion 14f) when the adjacent component is disposed over the recess 12a, 16a and supported by the non-recessed portions of the silicon surface (12b, 16b) of the wafer 12, 16 in which the recess 12a, 16a is formed.

In a final sub-step 104F of the step 104, remove shadow masks from the cover wafer (wafers 12, 16) after the deposition steps (the sub-steps 104D and 104E of the step 104). Preferably, prior to bonding, the wafers 12, 14, 16 should be cleaned, such as with DI water in a spin rinse dryer, or any other suitable method.

After completing of the step 104, the wafers 12, 14, 16 are arranged in proper order and orientation, heated, and subjected to pressure to cause fusion bonding of the wafers together, with bonding occurring where the silicon dioxide layer 18, 22 built up in the third step 103 are in contact with the middle wafer, and no bonding occurring where the respective silicon nitride layer 20, 24 is interposed between the silicon dioxide layers 18, 22 and the middle wafer 14, especially when the silicon nitride layer 20, 24 has a relatively high surface roughness.

In summary, FIG. 1 shows the overall surface composition of a MEMS device composed of wafers configured for selective fusion bonding during manufacture of the MEMS device. The MEMS device includes a first generally planar silicon wafer having a silicon dioxide layer formed thereon, a portion of the silicon dioxide layer having a silicon nitride layer deposited thereon. The MEMS device further includes a second generally planar silicon wafer micromachined to form a movable portion and a fixed portion, the fixed portion being bonded to the silicon dioxide layer of the first silicon wafer, the movable portion being movable relative to the fixed portion and disposed adjacent the silicon nitride layer, such that a line perpendicular to the first and second wafers passing through the movable portion would also pass through the silicon nitride layer. FIGS. 2 and 3 illustrate processes for achieving the structure shown in FIG. 1. First the adjacent surfaces of the wafers 12, 14, and 16 are cleaned, especially to remove organics. Then the native oxides are removed from the adjacent surfaces of the wafers 12, 14, and 16. Next an oxide layer (preferably a thermal silicon dioxide layer 18, 22) is formed on the surface of the wafer 12, 16 that faces the middle wafer 14, including within the recess 12a, 16a. Next, the silicon dioxide layer within the recess 12a, 16a may be roughened utilizing an etching process such as reactive ion etching or radiofrequency based dry etching methods. Next, the PECVD silicon nitride layer 20, 24 is deposited onto the silicon cover wafer recess 12a, 16a utilizing a re-usable shadow wafer to mask off areas which are not to be coated in rough silicon nitride, so that the masked-off areas remain amenable to fusion bonding.

Preferably the deposition of the PECVD silicon nitride layer 20, 24 into the recess 12a, 16a is initially made at a low deposition rate. In the sub-step 104D, the deposition of the PECVD silicon nitride layer 20, 24 into the recess 12a, 16a is preferably finished utilizing a final high deposition rate. The varying deposition rates of the silicon nitride layer 20, 24 will give good coverage and varying surface roughness on the silicon nitride layer 20, 24.

The thickness of the silicon nitride layer 20, 24 is determined by the final desired cavity clearance required between the sandwich structures (i.e., between the surface of the silicon nitride layer 20, 24 and the adjacent movable component 14f of the middle wafer 14. When the treatment of the unmasked areas is completed, a final sub-step 104E includes removing the shadow mask from the wafer surface. Preferably, prior to bonding, the wafers 12, 14, 16 should be cleaned, such as with DI water in a spin rinse dryer, or any other suitable method.

Once the wafers 12, 14, 16 are brought together for fusion bonding, the chemical properties of the silicon nitride layer 20, 24, and the surface roughness of the silicon nitride layer 20, 24 will inhibit the bonding of the middle wafers 14 to the cover wafers (upper wafer 12, lower wafer 16). The silicon nitride layers 20, 24 are also preferably deposited with a non-uniform distribution pattern, such that the general thickness (i.e., ignoring variations caused by surface roughness) of the silicon nitride layer 20, 24 varies from location to location, as seen in FIG. 1. This pattern should achieve the desired cavity clearance at the thickest part of the silicon nitride layer 20, 24. However, the distribution pattern should result in the silicon nitride layer 20, 24 being thinner away from the thickest part of the silicon nitride layer 20, 24 so as to minimize friction between a movable portion 14f of the middle wafer 14 and the silicon nitride layer 20, 24. The wafer can then be safely annealed after fusion bonding, for example at temperatures up to 1000 C for high bond strength, without degradation of the engineered surfaces that can facilitate the bonding of the middle wafer 14. In testing, this process has been successfully implemented to achieve cavity clearances from 2000 Angstroms (200 nanometers) to 2 microns.

The innovative combinations of processes described above will permit the practitioner to achieve selective fusion bonding of not only relatively smooth wafers, but also to achieve selective fusion bonding of wafers with features having relatively high and even non-uniform aspect ratios. For example, the processes taught above are believed to permit bonding surfaces of wafers forming parts of MEMS devices, in which recesses have been etched of varying relatively deep (greater than 2 microns) depth; these processes have been used to fusion bond wafers assembled into MEMS devices, the wafers having etched into them a variety of cavity depths, including, for example recesses with depths on the order of 2 microns to recesses on the order of 150 microns. In a typical wet chemical etch process, one has to spin coat a protective layer of photoresist across the surface of a wafer, expose it to light to pattern the photoresist, develop the photoresist to remove photoresist in unprotected areas, etch the unprotected areas, and then remove the remaining photoresist. It is extremely difficult to spin coat photoresist uniformly across a wafer that has many etched structures with varying aspect ratios. Even if this could be accomplished, which is doubtful, many steps have to be implemented to etch each wafer. In contrast, the innovative processes described herein use a hard mask (shadow mask) to protect areas which are not to be roughened by etching. Formation of the mask on a separate smooth surface, and mechanically aligning it with the wafer to be etched is a relatively straightforward process, much easier than spreading photoresist across a wafer that has multiple etched structures with varying aspect ratios. Additionally, the shadow mask can be reused with multiple wafers without requiring the difficult application of a sacrificial photoresist protective layer to direct the etching of each wafer to be etched.

The principles and modes of operation of this invention have been explained and illustrated in its preferred embodiments. However, it must be understood that this invention may be practiced otherwise than as specifically explained and illustrated without departing from its spirit or scope.

What is claimed is:

1. A method of selectively preparing a silicon surface for selective fusion bonding, comprising:
   a) aligning a silicon surface and a shadow mask so as to create a masked area and an unmasked area of the silicon surface;
   b) treating the unmasked area of the silicon surface to prevent fusion bonding, including depositing a layer of silicon nitride on the unmasked area of the silicon surface, wherein the silicon nitride is initially applied at a first deposition rate, and subsequently applied at a second deposition rate greater than the first deposition rate; and
   c) removing the shadow mask from the silicon surface after the treatment in step b).

2. The method of claim 1, wherein the silicon surface is a silicon dioxide layer, and wherein before step b) the silicon dioxide layer is roughened.

3. The method of claim 2, wherein the silicon dioxide layer is roughened utilizing one of radiofrequency etching and reactive ion etching.

4. The method of claim 1, wherein the first deposition rate is less than about 25 Angstroms per minute.

5. The method of claim 1, wherein the second deposition rate is equal to or greater than about 25 Angstroms per minute.

6. The method of claim 1, wherein the silicon nitride is applied utilizing Plasma-Enhanced Chemical Vapor Deposition (PECVD).

7. The method of claim 1, wherein in step b) the silicon nitride is non-uniformly deposited, such that the general thickness of the silicon nitride layer varies from location to location within the area the silicon nitride is deposited.

8. The method of claim 1, wherein in a preliminary step prior to step a), native oxides are removed.

9. The method of claim 8, wherein
   after the preliminary step and before step a) an oxide layer is formed on the silicon surface.

10. The method of claim 9, wherein the oxide layer is roughened prior to step b).

11. The method of claim 1, wherein prior to step a) a recess is formed in the silicon surface, the unmasked area of the silicon surface being disposed in the recess.

12. The method of claim 11, wherein before step a) an oxide layer is formed in the recess, including on at least a portion of the unmasked area.

13. The method of claim 12, wherein
   step b) includes depositing the layer of silicon nitride on the unmasked area of the silicon surface in the recess; and
   the deposition of silicon nitride in step b) is terminated when the depth of the recess less the combined thickness of the silicon nitride layer formed in step b) and the oxide layer provides a desired clearance to an adjacent component when the adjacent component is disposed over the recess and supported by non-recessed portions of the silicon surface.

14. The method of claim 1, wherein
   a recess is formed in the silicon surface, the unmasked area of the silicon surface being disposed in the recess;
   step b) includes depositing a layer of silicon nitride on the unmasked area of the silicon surface in the recess; and
   the deposition of nitride in step h) is terminated when the depth of the recess less the thickness of the silicon nitride layer formed in step h) provides a desired clearance to an adjacent component when the adjacent component is disposed over the recess and supported by the non-recessed portions of the silicon surface.

15. A method of selectively preparing a surface for selective fusion bonding, comprising:
   a) aligning a silicon surface defining a recess and a shadow mask so as to create a masked area and an unmasked area of the silicon surface;
   b) treating the unmasked area of the silicon surface to prevent fusion bonding, including non-uniformly depositing a layer of silicon nitride on the unmasked area of the silicon surface such that the general thickness of the silicon nitride layer varies from location to location within the area the silicon nitride is deposited and wherein the silicon nitride is deposited to form the silicon nitride layer in the recess such that the silicon nitride layer is generally thicker in a central portion of the recess, and thinner elsewhere; and
   c) removing the shadow mask from the silicon surface after the treatment in step b).

* * * * *

UNITED STATES PATENT AND TRADEMARK OFFICE
CERTIFICATE OF CORRECTION

PATENT NO.        : 9,006,844 B2                                   Page 1 of 1
APPLICATION NO.   : 13/574343
DATED             : April 14, 2015
INVENTOR(S)       : Parthiban Arunasalam It is certified that error appears in the above-identified patent and that said Letters Patent is hereby corrected as shown below:

In The Claims

Column 10, Claim 14, Line 30, delete "h)" and insert --b)--;

Column 10, Claim 14, Line 32, delete "h)" and insert --b)--.

Signed and Sealed this
Eleventh Day of August, 2015

Michelle K. Lee
*Director of the United States Patent and Trademark Office*